(12) United States Patent
Essaian

(10) Patent No.: US 6,674,144 B1
(45) Date of Patent: Jan. 6, 2004

(54) PROCESS FOR FORMING DAMASCENE-TYPE ISOLATION STRUCTURE FOR INTEGRATED CIRCUIT

(75) Inventor: Stepan Essaian, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/269,125

(22) Filed: Oct. 11, 2002

Related U.S. Application Data

(62) Division of application No. 09/552,412, filed on Apr. 19, 2000.

(51) Int. Cl.$^7$ .................. H01L 27/095; H01L 29/00; H01L 27/082
(52) U.S. Cl. .................. 257/474; 257/517; 257/557; 257/565
(58) Field of Search .................. 257/474, 517, 257/518, 552, 557–562, 565

(56) References Cited

U.S. PATENT DOCUMENTS

| | | | | |
|---|---|---|---|---|
| 4,631,803 A | | 12/1986 | Hunter et al. ................. | 29/576 |
| 4,666,556 A | * | 5/1987 | Fulton et al. ................. | 438/431 |
| 4,696,097 A | | 9/1987 | McLaughlin et al. .......... | 437/193 |
| 5,013,682 A | * | 5/1991 | Plumton et al. .............. | 438/489 |
| 5,376,562 A | | 12/1994 | Fitch et al. .................. | 437/31 |
| 5,496,745 A | | 3/1996 | Ryum et al. .................. | 437/31 |
| 5,620,907 A | | 4/1997 | Jalali-Farahani et al. ...... | 438/320 |
| 5,633,179 A | | 5/1997 | Kamins et al. ............... | 438/318 |
| 5,696,007 A | | 12/1997 | Ryum et al. .................. | 437/31 |
| 5,700,712 A | * | 12/1997 | Schwalke ..................... | 438/430 |
| 5,895,253 A | | 4/1999 | Akram ......................... | 438/424 |
| 5,991,487 A | * | 11/1999 | Sugiyama ..................... | 385/129 |
| 6,251,738 B1 | | 6/2001 | Huang ......................... | 438/312 |
| 6,287,930 B1 | * | 9/2001 | Park ........................... | 438/369 |

OTHER PUBLICATIONS

T. Yamaguchi et al., "Process Investigations for a 30–GHz $\zeta_T$ Submicrometer Double Poly–Si Bipolar Technology", Mar. 1994 IEEE Transactions on Electron Devices, vol. 41, No. 3, pp. 321–329.

K. Washio, "SiGe HBTs and ICs for Optical–Fiber Communication Systems", 1999 Solid–State Electronics, pp. 1619–1625.

M. Yoshida et al., "A Bipolar–Based 0.5 $\mu$m BiCMOS Technology on Bonded SOI for High–Speed LSIs", Aug. 1994, IEICE Trans. Electron, vol. E77–C, No. 8, pp. 1395–1403.

* cited by examiner

*Primary Examiner*—John F. Niebling
*Assistant Examiner*—Ron Pompey
(74) *Attorney, Agent, or Firm*—Stallman & Pollock LLP

(57) ABSTRACT

Isolation of a heterojunction bipolar transistor device in an integrated circuit is accomplished by forming the device within a trench in dielectric material overlying single crystal silicon. Precise control over the thickness of the initially-formed dielectric material ultimately determines the depth of the trench and hence the degree of isolation provided by the surrounding dielectric material. The shape and facility of etching of the trench may be determined through the use of etch-stop layers and unmasked photoresist regions of differing widths. Once the trench in the dielectric material is formed, the trench is filled with selectively and/or nonselectively grown epitaxial silicon. The process avoids complex and defect-prone deep trench masking, deep trench silicon etching, deep trench liner formation, and dielectric reflow steps associated with conventional processes.

4 Claims, 5 Drawing Sheets

PROCESS FOR FORMING DAMASCENE-TYPE ISOLATION STRUCTURE FOR INTEGRATED CIRCUIT

PRIORITY CLAIM

The present application is a division and claims priority to U.S. patent application Ser. No. 09/552,412, filed Apr. 19, 2000.

BACKGROUND OF THE INVENTION

1. Field of the Invention

The present invention relates to a process for forming an isolation structure for an integrated circuit, and in particular, to a process for forming an isolation structure for a heterojunction bipolar transistor utilizing a damascene-type process.

2. Description of the Related Art

In order to meet the demand for increased processing speeds, engineers have turned to designs such as high speed heterojunction bipolar transistors (HBT).

FIG. 1 shows a cross-sectional view of such an HBT transistor. Specifically, HBT transistor 100 features Si—Ge alloy base layer 102 overlying single crystal silicon collector 104. Si—Ge alloy layer 102 includes conductivity-altering dopant of a first conductivity type.

Single crystal silicon collector 104 contains conductivity-altering dopant of a second conductivity type opposite the first conductivity type. Single crystal silicon collector 104 also features heavily doped collector contact 106 and collector sinker 108 of the second conductivity type.

HBT transistor 100 also features polysilicon emitter 110 overlying Si—Ge alloy base 102. Polysilicon emitter 110 contains an extremely high concentration of dopant of the second conductivity type. Base contact portion 102a extends past overlying emitter 110 so as to allow electrical contact to be made with Si—Ge base 102.

The switching speed of the HBT device can be significantly degraded by effects such as parasitic capacitance. Therefore, substantial isolation between the device and the surrounding environment is required to maintain high speed operation.

Vertical isolation between collector 104 and underlying substrate 112 is provided by buried doped layer 114 containing dopant of the second conductivity type. Lateral isolation between HBT device 100 and adjacent devices formed in substrate 112 is accomplished by deep trench isolation structures 116. Deep trench isolation structures 116 penetrate to a depth of about 3 µm into single crystal silicon 112. Deep trench isolation structures 116 include silicon oxide trench liner layer 118 and borophosphosilicate (BPSG) glass fill material 120.

While satisfactory for some applications, the conventional HBT architecture shown in FIG. 1 suffers from a number of disadvantages. One disadvantage is parasitic capacitance. Capacitance arising between extended base contact portion 102a and the underlying collector 104 can prolong the switching speed of HBT 100, adversely affecting its performance in high speed applications.

Therefore, there is a need in the art for an HBT structure exhibiting minimum parasitic capacitance between base and collector.

FIGS. 2A–2F show a conventional process flow for forming a deep trench isolation structure. FIG. 2A shows the starting point for the process, wherein photoresist mask 130 is patterned over single crystal silicon substrate 112 to reveal unmasked regions 132. FIG. 2B shows the etching of single crystal silicon 112 in unmasked regions 132 to form deep trenches 116.

FIG. 2C shows removal of the photoresist mask, followed by chemical vapor deposition of silicon dioxide over single crystal silicon 112, including within deep trenches 116, to form silicon dioxide trench liner layer 118.

FIG. 2D shows removal of silicon dioxide material outside of deep trench 116, followed by the deposition of BPSG 120 over the entire surface. BPSG 120 penetrates into deep trenches 116, but the high aspect ratio of the trench interferes with even deposition of BPSG and creates voids 134.

Accordingly, FIG. 2E shows the step of reflowing BPSG 120 by heating. As a result of this reflow the viscosity of BPSG 120 decreases and BPSG 120 settles within deep trench 116, eliminating the voids.

FIG. 2F shows removal of BPSG 120 outside of deep trenches 116. This may be accomplished by chemical-mechanical polishing or another planarization technique such as isotropic etching.

While satisfactory for some applications, the process flow for forming the conventional deep trench isolation suffers from a number of disadvantages. In particular, the conventional process is relatively complex, requiring a number of masking, etching, filling, reflowing, and planarizing steps that increase defect rate and reduce yield.

Therefore, there is a need in the art for a simple and effective process for forming an effective isolation structure for a high-speed bipolar transistor structure.

SUMMARY OF THE INVENTION

The present invention relates to a process for forming an isolation structure for an integrated circuit utilizing a damascene-type technique. In one embodiment of the process flow in accordance with the present invention, a two-tiered silicon dioxide/silicon nitride stack is formed over a single crystal silicon. The top silicon nitride/silicon dioxide tier is etched first in a narrow region. Next, the bottom tier of the silicon nitride/silicon dioxide tier is etched in a broader region to form a trench having a narrow lower portion and a broad upper portion. Epitaxial silicon of the collector is then grown inside the trench, and the base and emitter are created over the epitaxial silicon lying within the trench.

A first embodiment of a process for forming an isolated semiconductor device in an integrated circuit comprises the steps of forming dielectric material over a semiconductor workpiece having a lattice structure, and forming a trench in the dielectric material to stop on the semiconductor workpiece. The trench is filled with a semiconductor material, and a semiconductor device is formed in the semiconductor material.

A first embodiment of an integrated circuit in accordance with the present invention comprises an inter-device isolation structure comprising dielectric material formed over a semiconductor workpiece having a lattice structure, and an active semiconductor device positioned within semiconductor material formed in a trench in the dielectric material and aligned to the lattice structure.

The features and advantages of the present invention will be understood upon consideration of the following detailed description of the invention and the accompanying drawings.

DETAILED DESCRIPTION

The present invention relates to a process for forming an isolation structure utilizing a damascene type process. Specifically, in one embodiment of a process flow in accordance with the present invention, a two-tiered silicon dioxide/silicon nitride stack is formed over single crystal silicon. A deep trench having a wide upper region and a narrow lower region is aligned to a margin and is formed by successively masking and etching the first $Si_3N_4/SiO_2$ and second $Si_3N_4/SiO_2$ tiers. Epitaxial silicon of the collector of the bipolar transistor is then formed within the lower portion of the deep trench. Base and emitter components of the bipolar transistor are formed over the collector, with the remaining $Si_3N_4/SiO_2$ stack between the filled trenches providing lateral device isolation of the devices.

FIGS. 3A–3G show cross-sectional views of a first embodiment of a process flow for forming an HBT transistor in accordance with the present invention.

Figure 3A:
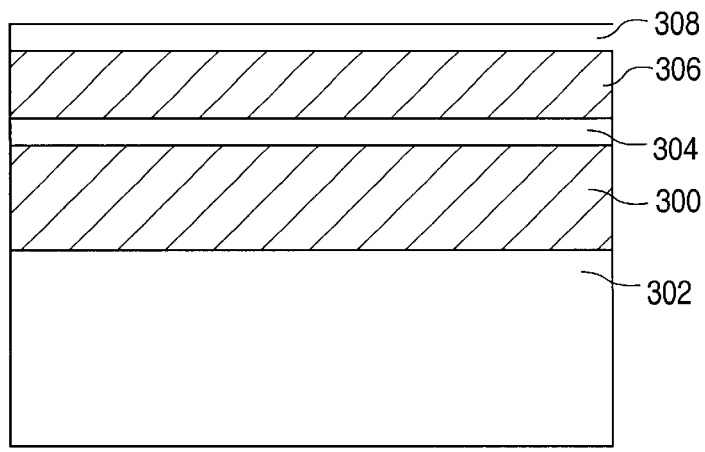
FIGS. 3A–3G show cross-sectional views of a first embodiment of a process flow in accordance with the present invention for forming an isolation structure for an HBT device.

FIG. 3A shows the starting point of the process, wherein first (2–4 μm) $SiO_2$ layer 300 is formed over single crystal silicon 302, and first (1000 Å) $Si_3N_4$ layer 304 is formed over first $SiO_2$ layer 300. Second (1 μm) $SiO_2$ layer 306 is then formed over first $Si_3N_4$ layer 304, and second (1000 Å) $Si_3N_4$ layer 308 is formed over second $SiO_2$ layer 306.

Figure 3B:
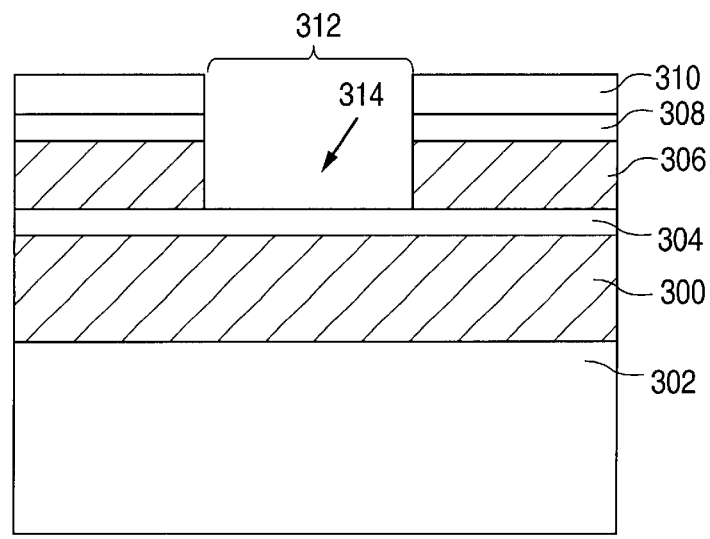

FIG. 3B shows the next step of the process, wherein first photoresist mask 310 is patterned to expose first narrow unmasked region 312. Second $Si_3N_4$ layer 308 and second $SiO_2$ layer 306 are then etched in exposed first narrow unmasked region 312 to form shallow trench 314.

Figure 3C:
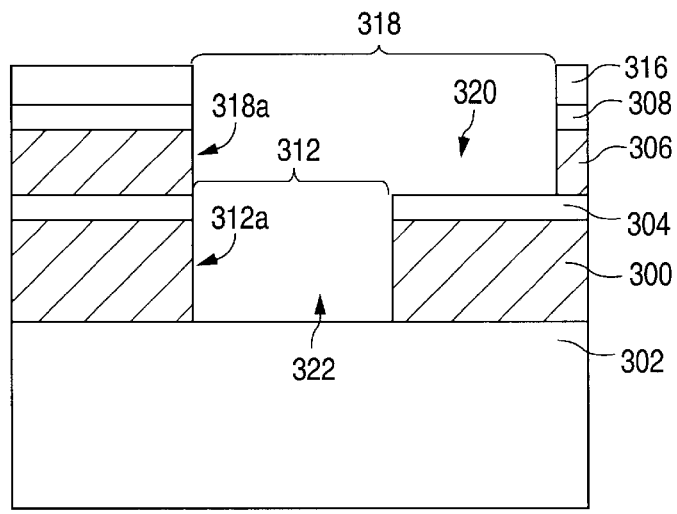

FIG. 3C shows the removal of the first photoresist mask followed by the patterning of second photoresist mask 316 to expose second unmasked region 318 broader than and encompassing first unmasked region 312. Left margin 318a of second unmasked region 318 is substantially aligned with the left margin 312a of first unmasked region 312. FIG. 3C also shows subsequent etching of exposed $Si_3N_4$ and $SiO_2$ in second unmasked region 318.

Because second unmasked region 318 is broader than and encompasses first unmasked region 312, portions of second layer 308 of the second dielectric material and portions of second layer 306 of the first dielectric material lying outside of first unmasked region 312 are also etched during this step. The etching step shown in FIG. 3C creates deep trench component 322 corresponding to first narrow region 312, and creates shallow trench component 320 corresponding to second broader region 318. Due to alignment of the left margins of the first and second unmasked regions, deep trench component 322 is positioned at the left margin.

Figure 3D:
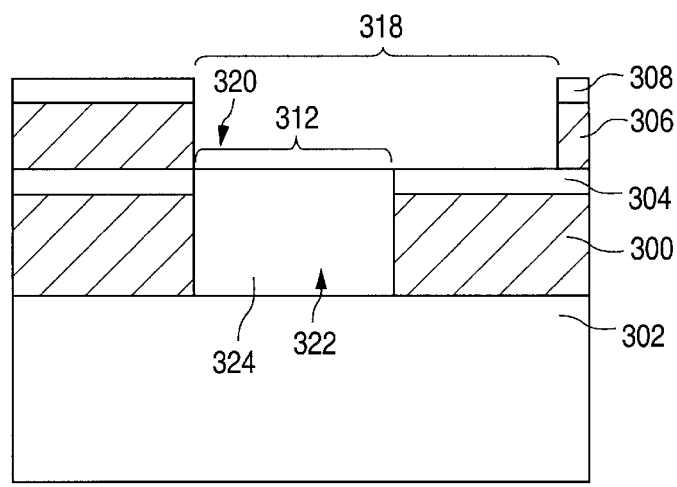

FIG. 3D shows the selective formation of epitaxial silicon 324 within deep trench component 322. Epitaxial silicon 324 is aligned to the underlying lattice structure of single crystal silicon substrate 302. Selective epitaxial silicon growth in the manner depicted may be accomplished by depositing epitaxial silicon in the presence of an ambient including dichlorosilane ($SiH_2Cl_2$) and HCl gases. In such a selective epitaxial growth process, the HCl eliminates polysilicon nucleation sites and thereby prevents polysilicon from forming in regions lacking an underlying single crystal silicon lattice.

Figure 3E:
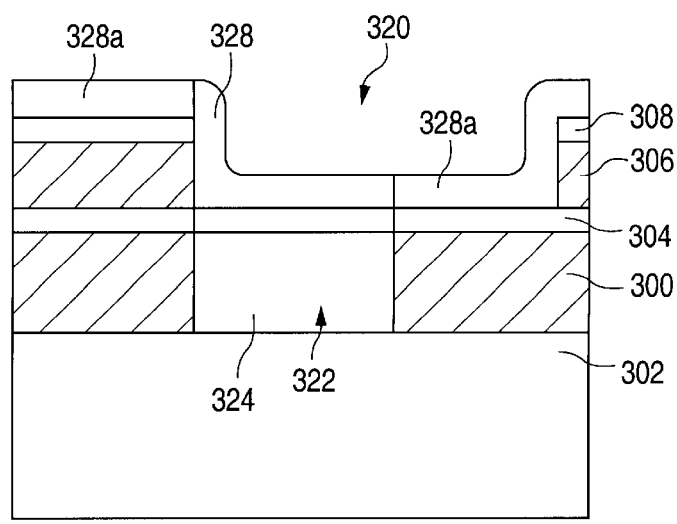

FIG. 3E shows the nonselective formation of first epitaxial silicon layer 328. Outside of deep trench component 322, first polysilicon layer 328a is formed instead of epitaxial silicon due to an absence of an underlying single crystal silicon lattice structure.

Figure 3F:
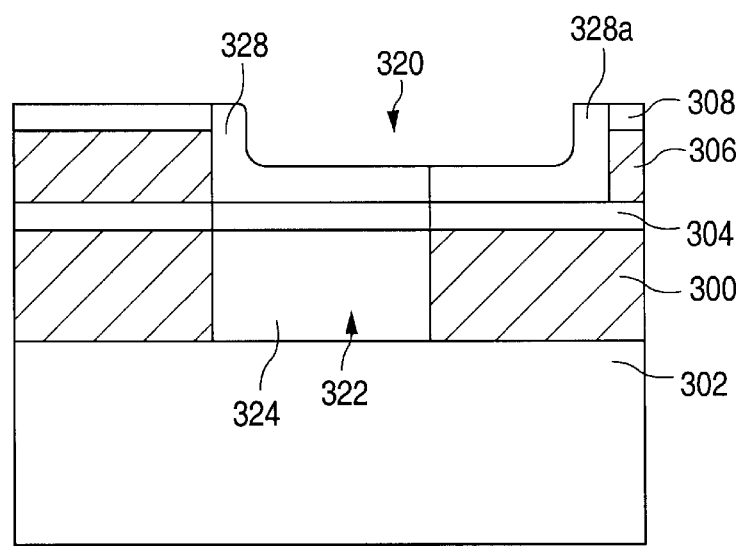

FIG. 3F shows removal of epitaxial silicon layer 328 and polysilicon layer 328a outside of shallow trench isolation component 320 by chemical mechanical polishing. Epitaxial silicon layer 328 within shallow trench isolation component 320 will form the collector of the HBT device to be subsequently created.

Figure 3G:
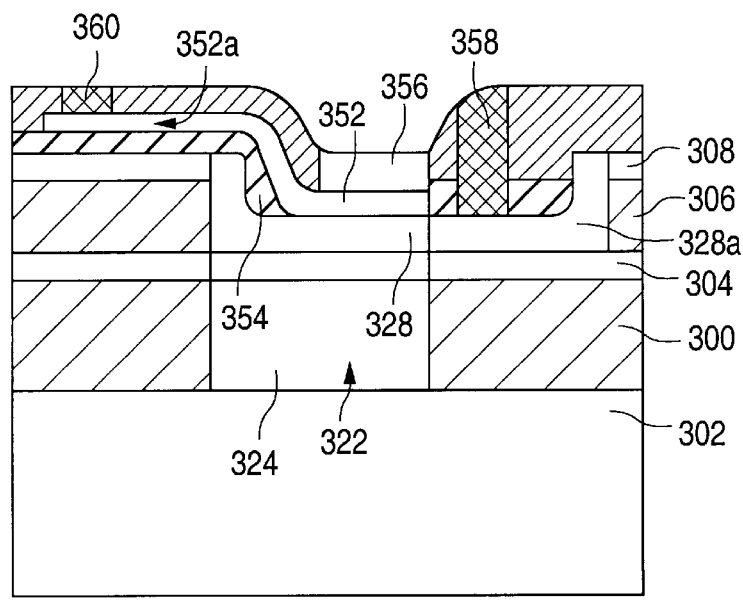

FIG. 3G shows completion of fabrication of HBT transistor 350 by the deposition of silicon oxide spacer 354, followed by formation and etching of doped Si—Ge base 352. Heavily doped polysilicon emitter 356 is then formed over doped Si—Ge base 352. Electrical contact to the collector takes place through collector contact 358. Electrical contact to base 352 takes place through base contact portion 352b which extends past the left margin of the device.

Thus as shown in FIGS. 3A–3G, the active HBT device is created within a trench formed in surrounding dielectric material.

Figure 1:
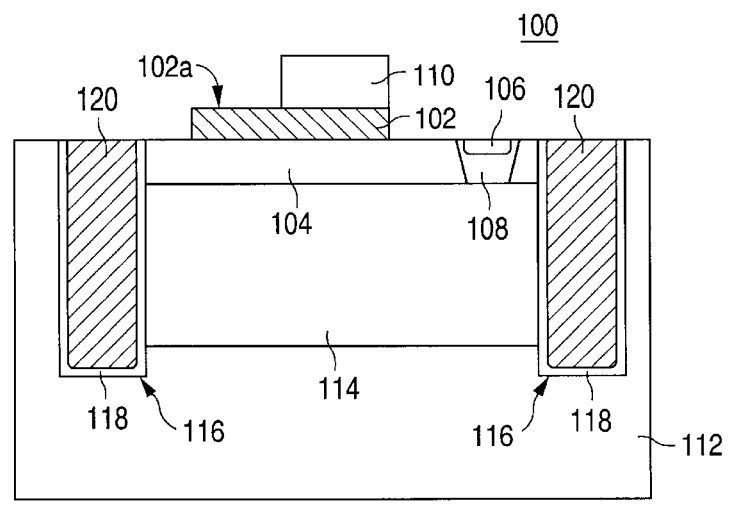
FIG. 1 shows a cross-sectional view of an HBT transistor utilizing conventional deep trench isolation.
Figure 2A:
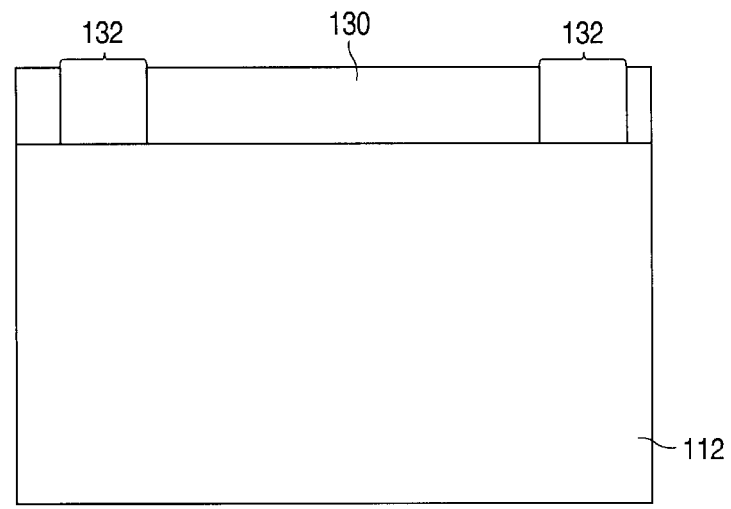
FIGS. 2A–2F show cross-sectional views of a conventional process flow for forming a deep trench isolation structure.
Figure 2B:
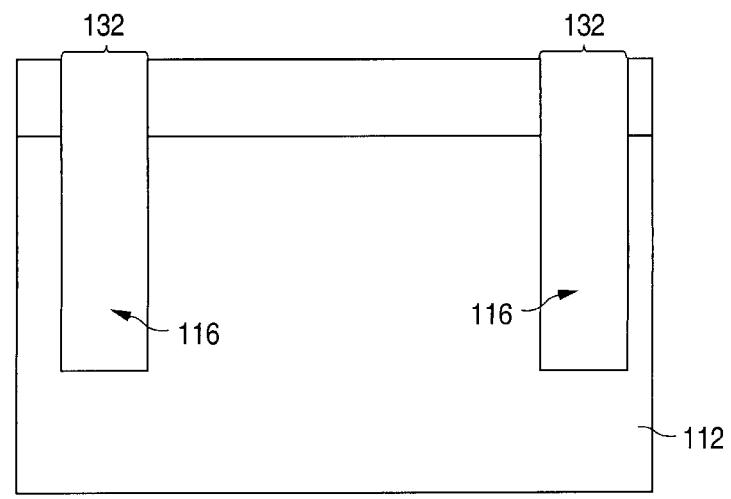
Figure 2C:
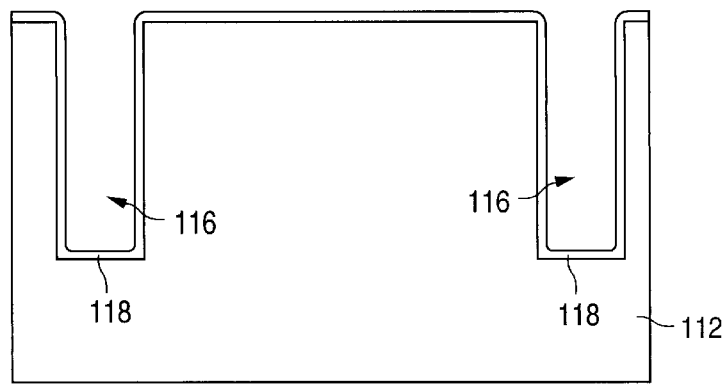
Figure 2D:
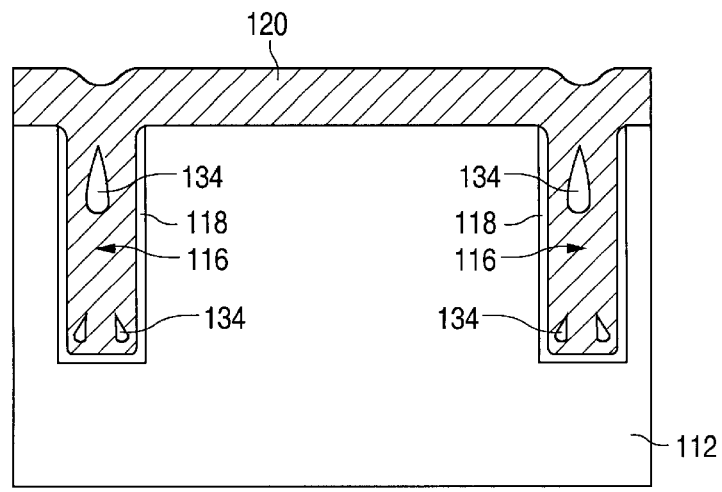
Figure 2E:
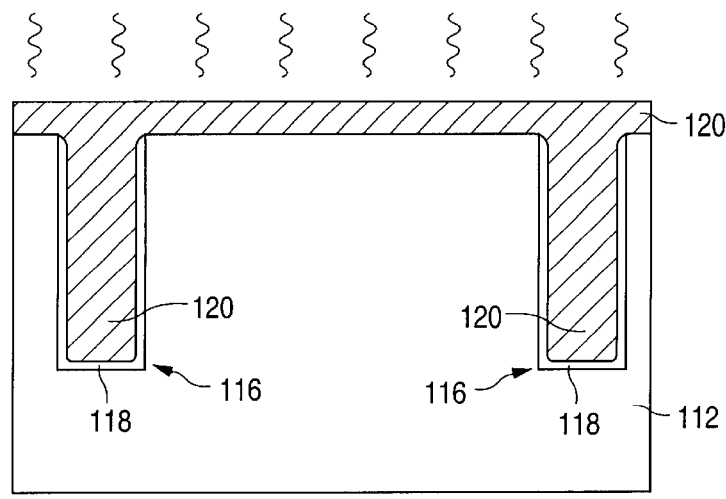
Figure 2F:
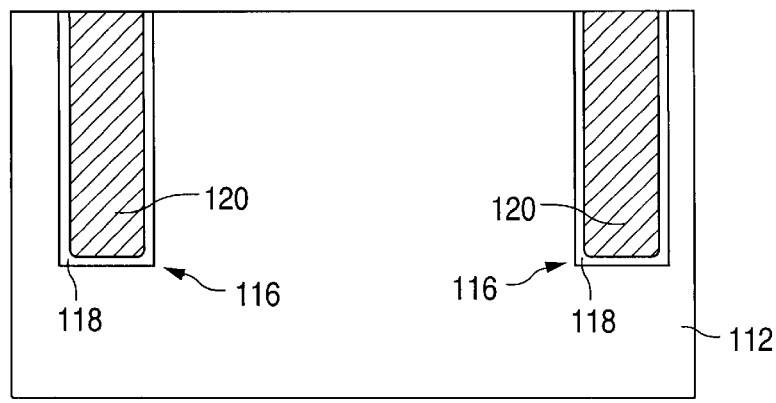

The active HBT device shown in FIG. 3G offers a number of important advantages over the conventional HBT shown in FIG. 1.

One important advantage is reduction in parasitic capacitance and increased switching speed. As evident from FIG. 3G, the single crystal silicon making up the collector of the HBT device is confined within the trench. Base/collector parasitic capacitance is thus reduced because base contact portion 352a of doped Si—Ge alloy layer 352 extends past the left margin of the trench and therefore does not overlap the collector.

In addition, much of doped Si—Ge alloy layer 352 is separated from the collector by thick silicon nitride and silicon oxide dielectric layers 308 and 306 respectively, further reducing the incidence of any parasitic capacitance between base and collector. Reduction in parasitic capacitance in the manner shown substantially improves device performance by permitting operation at extremely rapid switching speeds.

The process for forming an isolated semiconducting device in accordance with the present invention also offers a number of important advantages over conventional processes.

One important advantage is relative simplicity of the process flow. Rather than requiring complex and error-prone 1) deep trench masking, 2) deep trench silicon etching, 3) deep trench liner formation, and 4) dielectric reflow steps of the conventional process, the present invention forms the semiconductor device within a readily-etched trench in surrounding dielectric material selective to an underlying semiconductor workpiece. And as shown above, the shape and facility of etching the trench may be determined through the use of etch stop layers and unmasked photoresist regions of differing widths.

Another important advantage of the process in accordance with the present invention is effectiveness of the resulting isolation. Because the height (thickness) of the silicon nitride/silicon dioxide tiers formed over the single crystal silicon substrate can be precisely controlled by chemical vapor deposition, it is possible to design the dielectric material surrounding the active semiconductor device to be as thick as necessary in order to provide adequate electrical isolation for the device.

Although the present invention has so far been described in connection with one specific embodiment, the invention should not be limited to this particular embodiment. Various modifications and alterations in the structure and process will be apparent to those skilled in the art without departing from the scope of the present invention.

For example, while FIGS. 3A–3G illustrate formation of a semiconductor device within a trench in a two-tiered silicon nitride/silicon dioxide stack, this is not required by the present invention. A bipolar transistor device could be formed in a trench in a variety of configurations of dielectric materials, including such low-K materials such as fluorosilicate glass (FSG), nanoporous silica, or undoped gallium arsenide, and the process would still remain within the scope of the present invention.

Moreover, while FIG. 3C illustrates a process flow wherein the second photoresist mask is patterned to expose a second unmasked region larger than and encompassing the first unmasked region, this is also not required by the present invention. The second photoresist mask could create a second unmasked region smaller than and encompassed by the first unmasked region, and the process would still remain within the scope of the present invention. However, where an HBT device like that shown in FIG. 3G is being formed, alignment at a margin of the first and second unmasked regions would still be necessary to position the base contact portion substantially outside the device in order to obtain the benefit of reduced parasitic capacitance.

Furthermore, while FIGS. 3A–3G show a process that provides lateral isolation for an HBT device, this is also not required. A variety of semiconductor devices could be isolated in the manner taught by the present invention. Examples of other semiconductor devices eligible for isolation in accordance with the present invention include high voltage MOS and silicon bipolar transistors.

Given the above detailed description of the invention and the variety of embodiments described therein, it is intended that the following claims define the scope of the present invention, and that processes within the scope of these claims and their equivalents be covered hereby.

What is claimed is:

1. A heterojunction bipolar transistor (HBT) structure comprising:

a semiconductor workpiece;

an inter-device isolation structure that includes a first layer of silicon dioxide formed on the semiconductor workpiece, a first layer of silicon nitride formed on the first layer of silicon dioxide, a second layer of silicon dioxide formed on the first layer of silicon nitride, and a second layer of silicon nitride formed on the second layer of silicon dioxide;

trench formed in the inter-device isolation structure, the trench including a deep trench region that extends from an upper surface of the second layer of silicon nitride to a lower surface of the first layer of silicon dioxide such that an upper surface area of the semiconductor workpiece forms the bottom of the deep trench region, the trench further including a shallow trench region adjacent to the deep trench region and that extends from the upper surface of the second layer of silicon nitride to a lower surface of the second layer of silicon dioxide such that an upper surface area of the first layer of silicon nitride forms the bottom of the shallow trench region;

a first region of epitaxial silicon formed in the deep trench region to extend from the bottom of the deep trench region to the upper surface of the first layer of silicon nitride;

a second region of epitaxial silicon formed in the deep trench region on an upper surface of the first region of epitaxial silicon, the second region of epitaxial silicon comprising the collector of the HBT structure;

a first region of polysilicon formed on the bottom of shallow trench region;

a third layer of silicon dioxide formed on the upper surface of the second layer of silicon nitride, the upper surface of the second region of epitaxial silicon and the upper surface of the first region of polysilicon, the third layer of silicon dioxide having an opening formed therethrough to expose an upper surface area of the second region of epitaxial silicon;

a Si—Ge region formed on the third layer of silicon dioxide to extend over the second layer of silicon nitride and to extend into the opening formed through the third layer of silicon dioxide to be in electrical contact with the exposed upper surface area of the second region of epitaxial silicon, the Si—Ge region comprising the base of the HBT structure;

a fourth layer of silicon dioxide formed on the upper surface of the Si—Ge region and having a first opening formed therethrough to expose a first upper surface area of the Si—Ge region; and a second region of polysilicon formed to extend into the opening formed in the fourth layer of silicon dioxide to be in electrical contact with the exposed upper surface area of the Si—Ge region, the second region of polysilicon comprising the emitter of the HBT structure.

2. An HBT structure as in claim 1, and wherein the semiconductor workpiece comprises single crystal silicon.

3. An HBT structure as in claim 1, and further comprising:

a second opening formed in the fourth layer of silicon dioxide over the second layer of silicon nitride to expose a second upper surface area of the Si—Ge region; and a first conductive contact formed in the second opening to be in electrical contact with the Si—Ge region.

4. An HBT structure as in claim 3, and further comprising:

a third opening formed through the third and fourth layers of silicon dioxide to expose an upper surface area of the first region of polysilicon; and a second conductive contact formed in the third opening to be in electrical contact with the first region of polysilicon.

* * * * *